US010038262B1

(12) United States Patent
Behziz et al.

(10) Patent No.: US 10,038,262 B1
(45) Date of Patent: Jul. 31, 2018

(54) ELECTRICAL BRIDGE DEVICE INCLUDING A SUPPORT BRACKET AND A FLEX BRIDGE SUBASSEMBLY

(71) Applicant: TE CONNECTIVITY CORPORATION, Berwyn, PA (US)

(72) Inventors: Arash Behziz, Newbury Park, CA (US); Brian Patrick Costello, Scotts Valley, CA (US); Michael David Herring, Apex, NC (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/453,172

(22) Filed: Mar. 8, 2017

(51) Int. Cl.
*H01R 12/00* (2006.01)
*H05K 1/00* (2006.01)
*H01R 12/79* (2011.01)
*H01R 12/71* (2011.01)

(52) U.S. Cl.
CPC .......... *H01R 12/79* (2013.01); *H01R 12/712* (2013.01)

(58) Field of Classification Search
CPC ........ H01R 9/096; H01R 12/52; H01R 12/59; H01R 12/77; H01R 12/78; H01R 12/716; H01R 12/79; H01R 12/712
USPC ...................................... 439/74, 71, 493, 65
See application file for complete search history.

(56) References Cited

U.S. PATENT DOCUMENTS

| 6,561,821 | B1 * | 5/2003 | Yu .......................... | H01R 9/096 439/591 |
| 6,695,622 | B2 * | 2/2004 | Korsunsky ............. | H01R 31/06 439/631 |
| 6,918,774 | B2 * | 7/2005 | Wu ..................... | H01R 13/6658 439/607.05 |
| 7,044,748 | B2 * | 5/2006 | Korsunsky ............... | H05K 1/14 439/631 |
| 7,621,754 | B2 * | 11/2009 | Costello ............. | H01R 13/7031 439/378 |
| 7,907,419 | B2 * | 3/2011 | Costello ................. | H05K 7/142 174/138 E |
| 7,985,079 | B1 * | 7/2011 | Wilson .................... | H01R 12/52 439/74 |
| 8,721,350 | B2 * | 5/2014 | Liu ..................... | H01R 13/6315 439/65 |
| 2009/0103273 | A1 * | 4/2009 | Costello ................. | H05K 7/142 361/756 |

* cited by examiner

Primary Examiner — Hae Moon Hyeon

(57) ABSTRACT

An electrical bridge device includes a support bracket and a flex bridge subassembly. The support bracket includes a frame that extends axially between top and bottom ends of the support bracket. The flex bridge subassembly includes upper and lower carriers held in the frame at least proximate to the top and bottom ends, respectively. The flex bridge subassembly further includes an electrically conductive flex circuit strip coupled to and extending between the upper and lower carriers. The flex circuit strip electrically connects to a first connector on a host circuit board and a second connector on a mating circuit board to provide an electrical circuit path between the host circuit board and the mating circuit board. The upper carrier within the frame is floatable relative to the support bracket to allow the flex circuit strip to align with the second connector.

20 Claims, 9 Drawing Sheets

ELECTRICAL BRIDGE DEVICE INCLUDING A SUPPORT BRACKET AND A FLEX BRIDGE SUBASSEMBLY

BACKGROUND OF THE INVENTION

The subject matter herein relates generally to electrical bridge devices that extend between electrical devices and provide electrical conductive paths that electrically connect the electrical devices.

Various electrical applications require an electrical connection between two parallel printed circuit boards (or other electrical devices). Known bridge devices for electrically connecting the circuit boards include electrical cable assemblies, stackable mezzanine connectors, bridging mid-planes coupled between board-to-board connectors mounted on the circuit boards, and bridging circuit boards extending between card edge connectors mounted on the circuit boards. These known bridge devices have several issues. For example, the cable assemblies are generally costly, especially for cable assemblies that provide relatively high data transfer rates between the circuit boards. The other known bridge devices generally suffer from mechanical alignment challenges due to tolerance stackup. For example, in an electrical system with multiple components that couple together, such as a server, the accumulated variation allowed by specified tolerances and dimensions may result in a gap distance between the two circuit boards that is difficult to accurately predict for sizing and positioning the bridge device. Due to tolerance stackup, the known bridge devices may not properly align with and/or connect to both circuit boards. The misalignment may cause reduced electrical performance, if not a complete lack of performance, increased forces applied to the bridge device and/or the connectors on the circuit boards, and/or damage to one or more of the electrical components.

A need remains for an electrical bridge device that is relatively low cost and able to accommodate variations attributable to tolerance stackup.

BRIEF DESCRIPTION OF THE INVENTION

In an embodiment, an electrical bridge device is provided that includes a support bracket and a flex bridge subassembly. The support bracket extends a height between a top end and an opposite bottom end. The bottom end is configured to be mounted to a host circuit board. The support bracket includes a frame that extends axially between the top and bottom ends. The flex bridge subassembly includes an upper carrier held in the frame at least proximate to the top end and a lower carrier held in the frame at least proximate to the bottom end and spaced apart from the upper carrier along the height of the support bracket. The flex bridge subassembly further includes an electrically conductive flex circuit strip coupled to the upper carrier and the lower carrier and extending therebetween. The flex circuit strip extends between a host end and a mating end. The host end is configured to electrically connect to a first connector on the host circuit board and the mating end is configured to electrically connect to a second connector on a mating circuit board to provide an electrical circuit path between the host circuit board and the mating circuit board. The upper carrier within the frame is floatable relative to the support bracket to allow the mating end of the flex circuit strip to align with the second connector.

In an embodiment, an electrical bridge device is provided that includes a support bracket and a flex bridge subassembly. The support bracket extends a height between a top end and an opposite bottom end. The bottom end is configured to be mounted to a host circuit board. The support bracket includes a guide barrel and a frame coupled to the guide barrel. The frame extends axially between the top and bottom ends. The guide barrel defines an aperture that is open along the top end for receiving an alignment pin that is mounted to a mating circuit board. The flex bridge subassembly includes an upper carrier held in the frame at least proximate to the top end and a lower carrier held in the frame at least proximate to the bottom end and spaced apart from the upper carrier along the height of the support bracket. The flex bridge subassembly further includes an electrically conductive flex circuit strip coupled to the upper carrier and the lower carrier and extending therebetween. The flex circuit strip extends between a host end and a mating end. The host end is configured to electrically connect to a first connector on the host circuit board and the mating end is configured to electrically connect to a second connector on the mating circuit board to provide an electrical circuit path between the host circuit board and the mating circuit board. The upper carrier within the frame is floatable relative to the support bracket. The guide barrel receiving the alignment pin provides coarse alignment between the mating end of the flex circuit strip and the second connector, and the floatability of the upper carrier within the frame allows for fine alignment between the mating end of the flex circuit strip and the second connector.

DETAILED DESCRIPTION OF THE INVENTION

Figure 1:
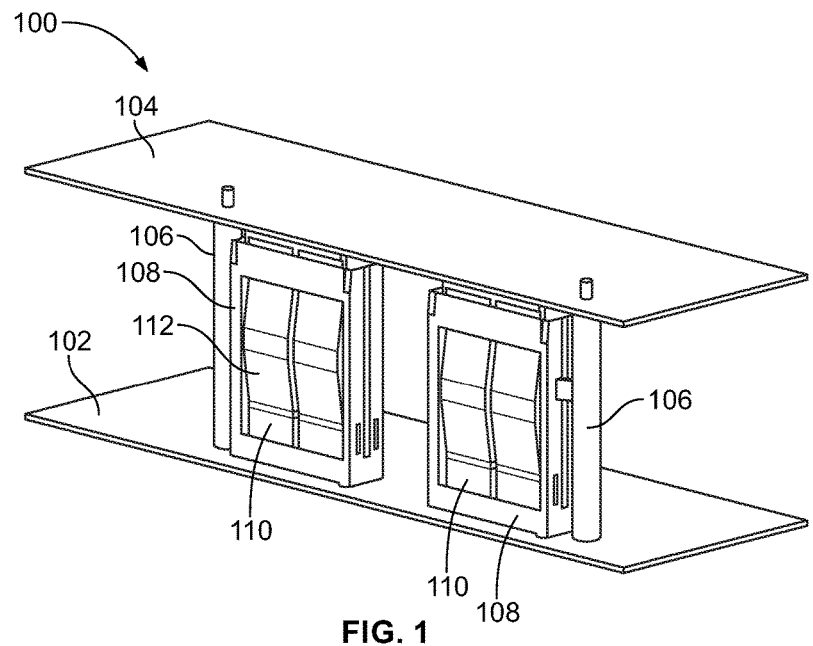
FIG. 1 illustrates an electrical system formed in accordance with an embodiment.
Figure 2:
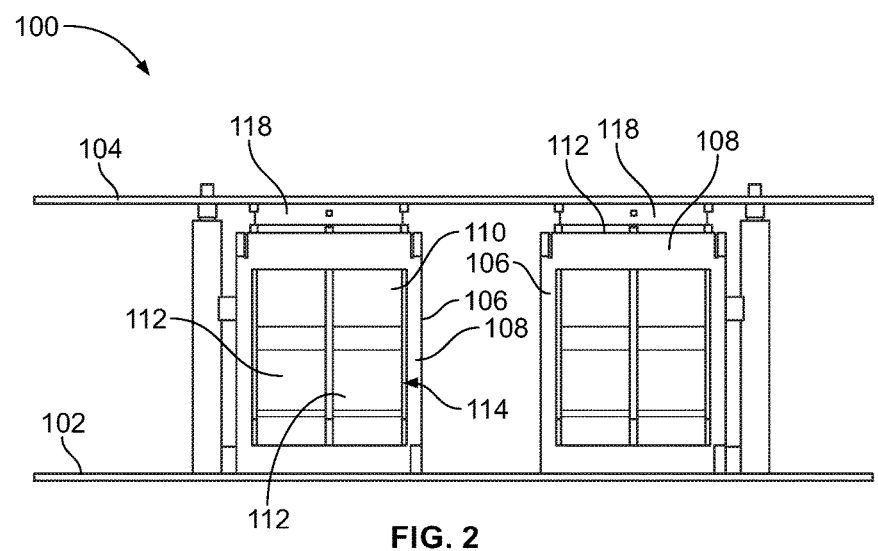
FIG. 2 illustrates a front view of the electrical system.

FIG. 1 illustrates front perspective an electrical system 100 formed in accordance with an embodiment. FIG. 2 illustrates a front view of the electrical system 100. The electrical system 100 includes a first circuit board 102 and a second circuit board 104 that is spaced apart from the first circuit board 102. The first and second circuit boards 102, 104 extend parallel to each other. Although not shown, the first and second circuit boards 102, 104 may be commonly disposed within a housing or case of a server, a personal computer, or another electrical device. The electrical system 100 further includes two electrical bridge devices 106 that each extend between the circuit boards 102, 104. The electrical bridge devices 106 electrically connect to both circuit boards 102, 104 and provide an electrically conductive signal path to allow for signal transmission from the first circuit board 102 to the second circuit board 104, and vice-versa. For example, the electrical bridge devices 106 may support relatively high signal transmission rates between the circuit boards 102, 104, such as 10 Gb/s, 20 Gb/s, or greater. Although two electrical bridge devices 106 are shown, in other embodiments the electrical system 100 may include only one electrical bridge device 106 or more than two bridge devices 106 connecting the two circuit boards 102, 104.

The electrical bridge devices 106 include a support bracket 108 and a flex bridge subassembly 110 that is held and supported by the support bracket 108. The flex bridge subassembly 110 includes at least one electrically conductive flex circuit strip 112. In the illustrated embodiment, two flex circuit strips 112 are visible in each electrical bridge device 106. The two flex circuit strips 112 of each electrical bridge device 106 are disposed side-by-side and visible through a window 114 of the corresponding support bracket 108. The electrical bridge devices 106 in various embodiments may have any number of flex circuit strips 112, such as one, two, four, or the like. The flex circuit strips 112 are electrically conductive and provide the conductive signal paths between the circuit boards 102, 104.

The electrical bridge devices 106 mate to corresponding connectors on the first and second circuit boards 102, 104. The connectors include first connectors 116 (shown in FIG. 8) mounted to the first circuit board 102 and second connectors 118 mounted to the second circuit board 104. The connectors 116, 118 may be identical or at least similar to each other. For example, the connectors 116, 118 may be card edge connectors that define receptacle slots (shown in FIGS. 8 and 10) configured to receive an end segment of a mating circuit card therein. Each flex circuit strip 112 is configured to mate, at one end thereof, to a corresponding first connector 116 on the first circuit board 102 and, at the opposite end, to a corresponding second connector 118 on the second circuit board 104.

Each electrical bridge device 106 is electrically connected between the circuit boards 102 and 104 by first mating to the connector 116 on the first circuit board 102 and then subsequently mating to the connector 118 on the second circuit board 104, or vice-versa. The first circuit board 102 is referred to herein as a host circuit board 102 because the electrical bridge device 106 mates to the first connectors 116 (shown in FIG. 8) mounted on the first circuit board 102 prior to mating to the second connectors 118 mounted on the second circuit board 104. Furthermore, the support brackets 108 of the electrical bridge devices 106 optionally are mounted to the host circuit board 102 independently of any engagement with the connectors 116. Therefore, the host circuit board 102 basically hosts the electrical bridge devices 106. The second circuit board 104 is referred to herein as a mating circuit board 104 because, after the electrical bridge devices 106 are connected to the host circuit board 102 via the first connectors 116, the second circuit board 104 is moved relative to the electrical bridge devices 106 and the host circuit board 102 to allow the second connectors 118 to mate to the electrical bridge devices 106. The mating of the electrical bridge devices 106 to the second connectors 118 of the mating circuit board 104 establishes the conductive signal path between the circuit boards 102, 104.

Although not shown in FIGS. 1 and 2, the circuit boards 102, 104 may be secured in place to one or more components, such as to a motherboard, a panel of a housing, or the like, within an electrical device. Small tolerances and variations in component dimensions and attachment positions, when aggregated among several interconnected components of the electrical device, can result in a tolerance stackup that is difficult to accurately and precisely predict prior to assembling the electrical device. For example, due to tolerance stackup, the actual measured distance between the host and the mating circuit boards 102, 104 may vary within a noticeable margin, such as 0.1% to 5%, of an expected distance. In various embodiments disclosed herein, the electrical bridge devices 106 are configured to accommodate at least some variations attributable to tolerance stackup to allow the electrical bridge devices 106 to properly mate to both the first electrical connectors 116 (shown in FIG. 8) on the host circuit board 102 and the second electrical connectors 118 on the mating circuit board 104 (without diminishing signal transfer rates or quality and without applying excessive strain on the bridge devices 106).

Figure 3:
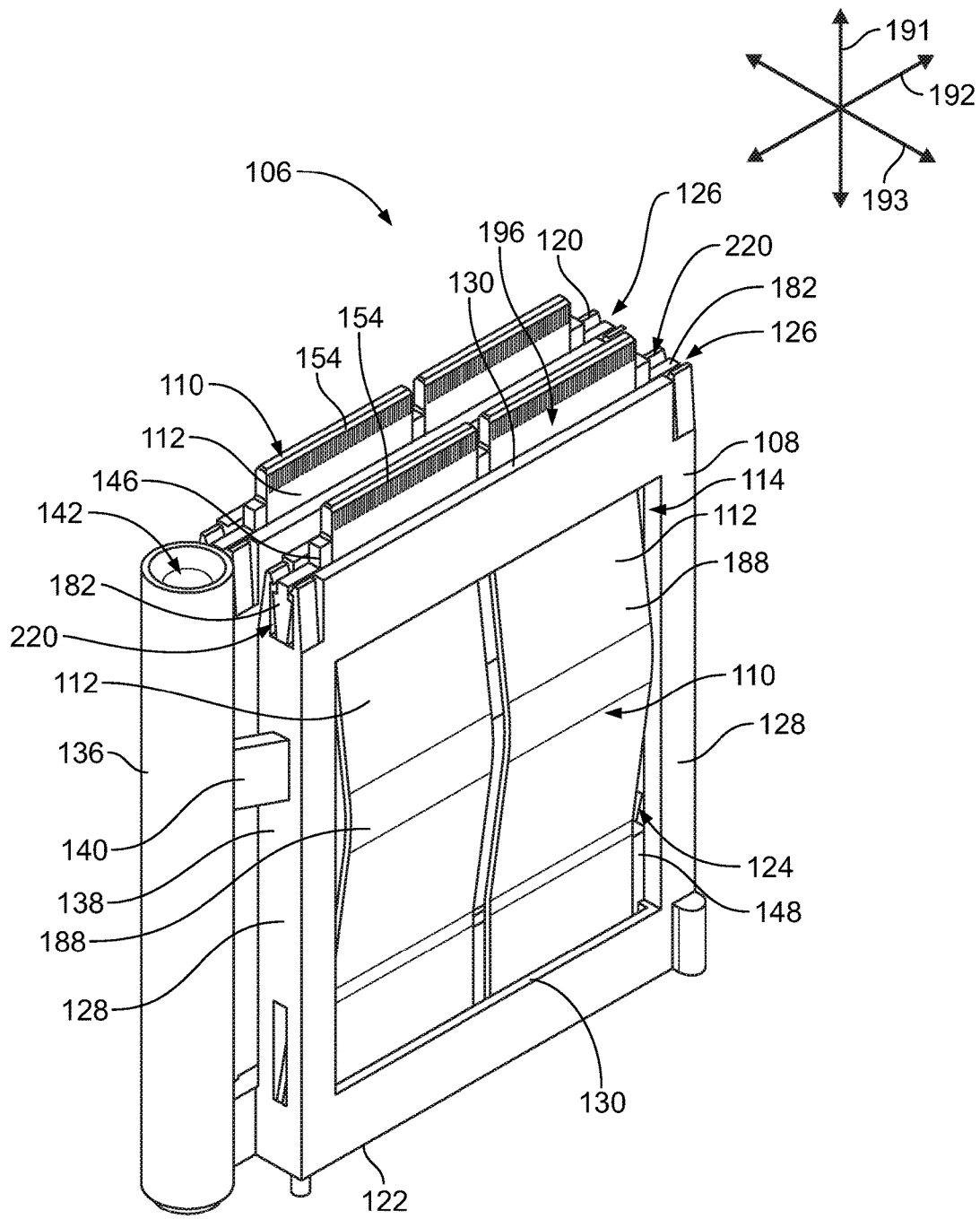
FIG. 3 is a front perspective view of an electrical bridge device of the electrical system according to an embodiment.
Figure 4:
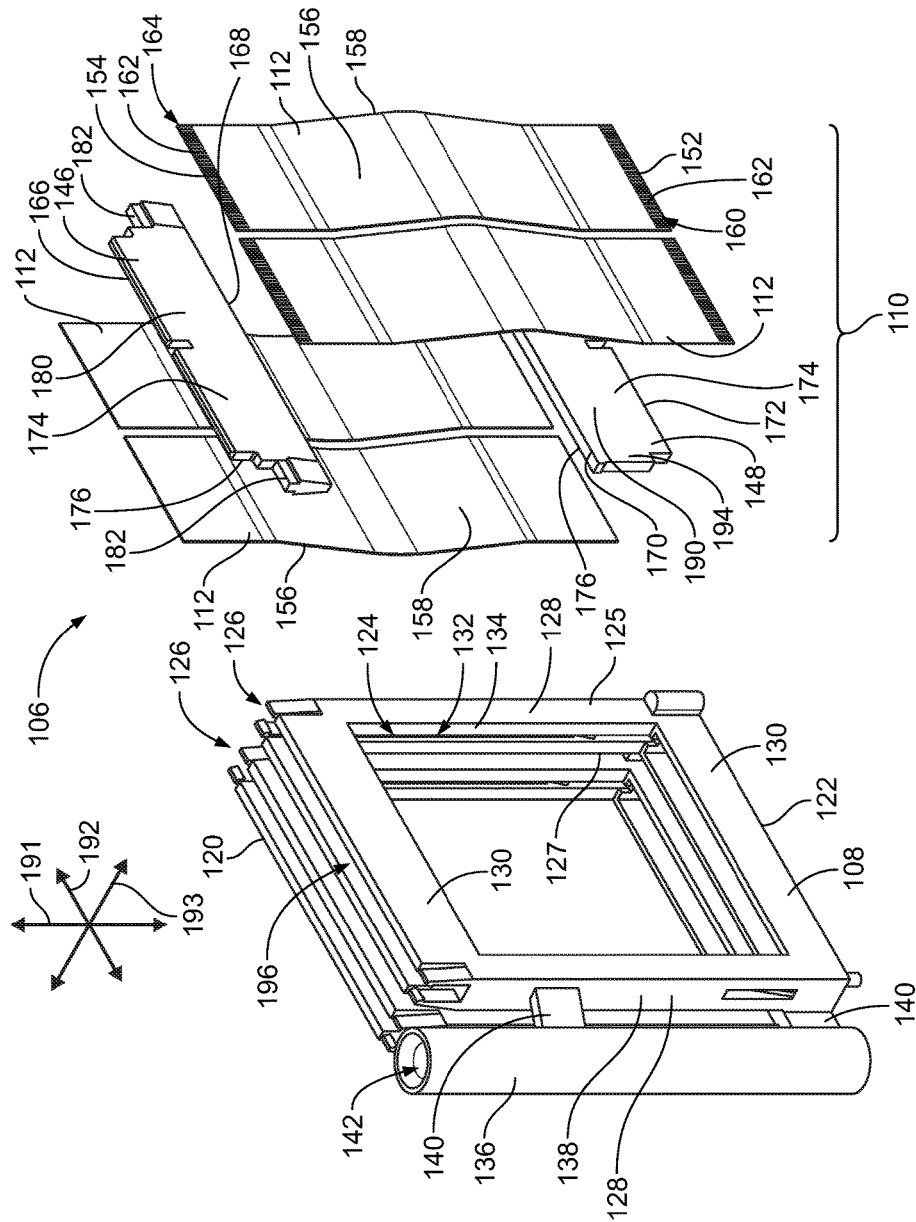
FIG. 4 is an exploded perspective view of the electrical bridge device shown in FIG. 3.
Figure 5:
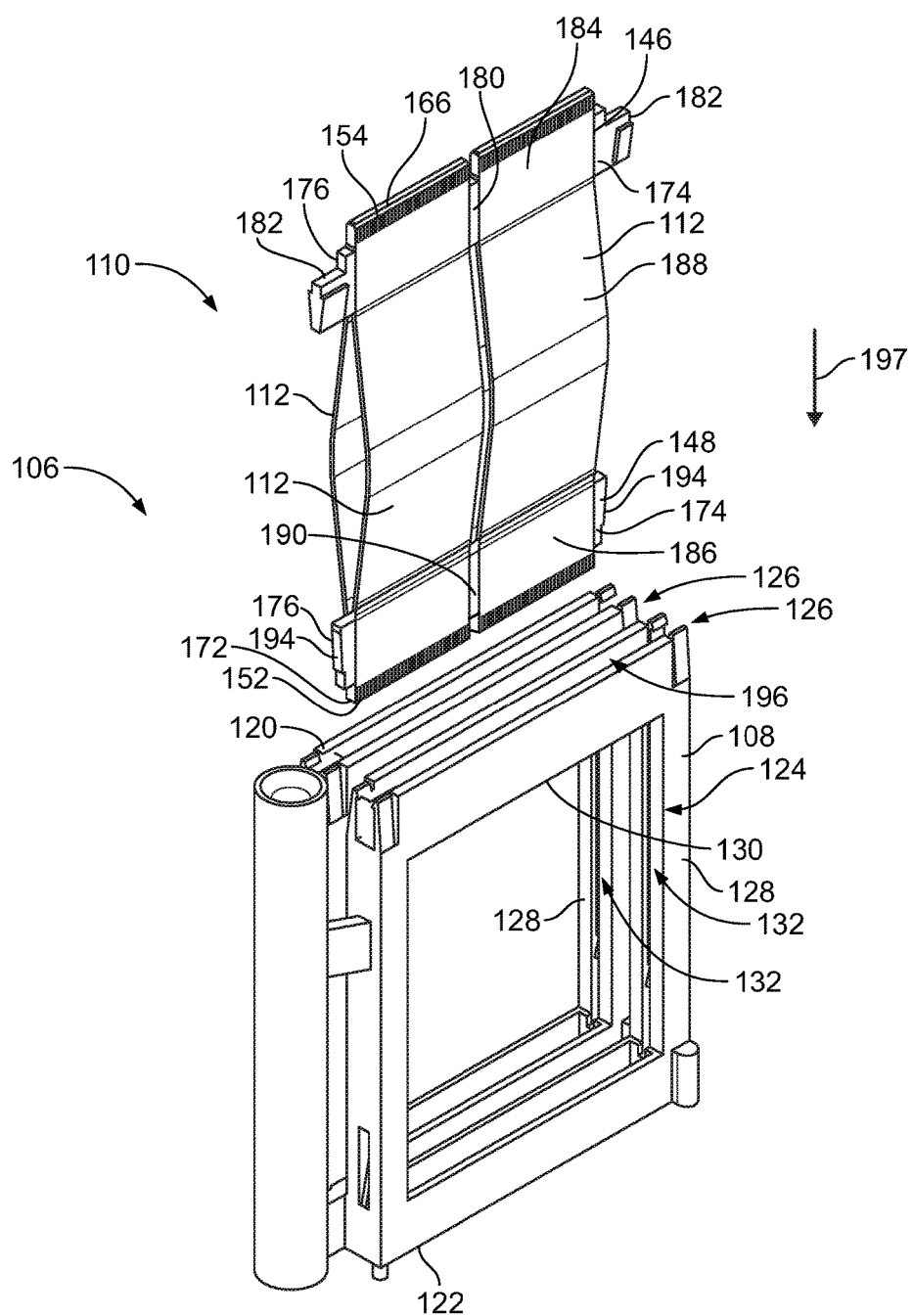
FIG. 5 is perspective view of a flex bridge subassembly of the electrical bridge device poised for loading into a support bracket of the electrical bridge device during assembly of the electrical bridge device.

FIG. 3 is a front perspective view of the electrical bridge device 106 according to an embodiment. FIG. 4 is an exploded perspective view of the electrical bridge device 106 shown in FIG. 3. FIG. 5 is perspective view of the flex bridge subassembly 110 of the electrical bridge device 106 poised for loading into the support bracket 108 during assembly of the electrical bridge device 106. The electrical bridge device 106 is oriented with respect to a vertical or elevation axis 191, a lateral axis 192, and a longitudinal axis 193. The axes 191-193 are mutually perpendicular. Although the vertical axis 191 appears to extend generally parallel to gravity, it is understood that the axes 191-193 are not required to have any particular orientation with respect to gravity.

The support bracket 108 of the electrical bridge device 106 extends a height along the vertical axis 191 between a top end 120 and an opposite bottom end 122. As used herein, relative or spatial terms such as "top," "bottom," "front," "rear," "first," "second," "upper," and "lower" are only used to distinguish the referenced elements of the electrical bridge device 106 and do not necessarily require particular positions or orientations relative to the electrical system 100 (shown in FIG. 1) and/or the surrounding environment. For example, the electrical bridge device 106 may be oriented within an electrical device such that the top end 120 is below the bottom end 122. The flex bridge subassembly 110 is held within a frame 126 of the support bracket 108.

As shown in FIG. 4, the frame 126 defines a track 124 that engages the flex bridge subassembly 110. The track 124 of the frame 126 extends along the vertical axis 191 between the top end 120 and the bottom end 122 of the support bracket 108. The frame 126 has two parallel guide members 128 and cross members 130 that extend between and connect the two guide members 128. For example, the guide members 128 may extend along the vertical axis 191 and the cross members 130 may extend along the lateral axis 192. Each of the guide members 128 includes a channel 132 that defines a portion of the track 124. The channel 132 is defined along an interior surface 134 of each guide member 128 that faces the opposing guide member 128 of the same frame 126. In the illustrated embodiment, each guide member 128 includes a single elongated channel 132 extending at least most of the height of the frame 126. But, in an alternative embodiment, the channels 132 may be shorter. For example, each guide member 128 may include one channel 132 located proximate to the bottom end 122 and another channel 132 (or other opening) located proximate to the top end 120, where the two channels 132 are spaced apart along the height of the guide member 128. The flex bridge subassembly 110 is held in the track 124 between a front wall 125 of the frame 126 and a rear wall 127 of the frame 126.

In the illustrated embodiment, the support bracket 108 includes two frames 126 stacked side-by-side along the longitudinal axis 193. Therefore, the support bracket 108 is configured to hold two flex bridge subassemblies 110, as shown in FIG. 3. One flex bridge subassembly 110 is held in the track 124 of each of the two frames 126. The frames 126 are fixed to each other.

The support bracket 108 also includes a guide barrel 136 that is coupled to the frames 126. In the illustrated embodiment, the guide barrel 136 is mounted to an exterior surface 138 of a guide member 128 of each of the frames 126 via attachment arms 140. The guide barrel 136 extends along the vertical axis 191. The guide barrel 136 is generally cylindrical and defines an aperture 142. The aperture 142 extends a length along the height of the guide barrel 136, and optionally extends the entire length of the guide barrel 136 between the top end 120 and the bottom end 122 of the support bracket 108. The aperture 142 is open at the top end 120 and is configured to receive an alignment pin 144 (shown in FIG. 9) therein through an opening at the top end 120.

The support bracket 108 may be composed of one or more relatively rigid materials, such as plastics or metals, to structurally support the flex bridge subassembly 110 held within the support bracket 108. In an embodiment, the support bracket 108 is composed of one or more plastic materials and is formed via a molding process. The guide barrel 136 may be formed integral to the frames 126, or, alternatively, may be formed separately from the frames 126 and subsequently coupled to the frames 126 via the attachment arms 140.

The flex bridge subassembly 110, as shown in FIG. 4, includes an upper carrier 146, a lower carrier 148, and at least one flex circuit strip 112. In the illustrated embodiment, the flex bridge subassembly 110 includes four flex circuit strips 112. When assembled, each of the flex circuit strips 112 is coupled to both the upper carrier 146 and the lower carrier 148. The upper and lower carriers 146, 148 are held in one of the frames 126 of the support bracket 108 when the electrical bridge device 106 is fully assembled as shown in FIG. 3.

Referring to FIG. 4, the flex circuit strips 112 may be identical or at least similar to one another, such that the following description of one flex circuit strip 112 applies to all of the illustrated flex circuit strips 112. The flex circuit strip 112 extends a length or height between a host end 152 and a mating end 154. The flex circuit strip 112 has a first side 156 and an opposite second side 158. The first and second sides 156, 158 may be generally planar or flat. Although not shown, the flex circuit strip 112 includes a conductive layer of one or more conductors bonded to a thin dielectric film. The one or more conductors may be composed of a metallic material, and the dielectric film may be composed of a polymer material, such as polyethylene or a polyamide. For example, the conductive layer may be encased by the dielectric film such that the dielectric film defines both the first and second sides 156, 158. The flex circuit strip 112 includes a first set 160 of contact pads 162 at the host end 152 and a second set 164 of contact pads 162 at the mating end 154. The host end 152 of the flex circuit strip 112 is configured to electrically connect to the first connector 116 (shown in FIG. 8) on the host circuit board 102 (FIG. 2). The mating end 154 of the flex circuit strip 112 is configured to electrically connect to the second connector 118 (FIG. 2) on the mating circuit board 104 (FIG. 2). The host end 152 may be structurally identical or at least similar to the mating end 154. The first and second sets 160, 164 of contact pads 162 may be located on the first side 156 of the flex circuit strip 112. The second side 158 of the flex circuit strip 112 engages the upper and lower carriers 146, 148. Optionally, the second side 158 does not include any contact pads.

The orientations of the upper carrier 146 and the lower carrier 148 in the exploded view in FIG. 4 are the same orientations that the carriers 146, 148 have in the assembled flex bridge subassembly 110 shown in FIG. 5. For example, the upper carrier 146 extends vertically between an outer end 166 and an opposite inner end 168. The lower carrier 148 extends vertically between an inner end 170 and an opposite outer end 172. The inner end 168 of the upper carrier 146 faces the inner end 170 of the lower carrier 148 in the assembled flex bridge subassembly 110. The upper carrier 146 and the lower carrier 148 are generally planar and include respective front sides 174 and opposite rear sides 176.

The upper carrier 146 includes a main body portion 180 and two ears 182 that extend laterally from the main body portion 180 in opposite directions. The ears 182 define lateral ends of the upper carrier 146 along the lateral axis 192. In an embodiment, the upper carrier 146 has a unitary, one-piece body such that the ears 182 are integral to the main body portion 180, but in an alternative embodiment the ears 182 may be discrete components that are coupled to the main body portion 180. The lower carrier 148 includes a main body portion 190 and two ledges 194 that extend laterally from the main body portion 190 in opposite directions. The ledges 194 define lateral ends of the lower carrier 148 along the lateral axis 192. The lower carrier 148 may have a unitary-one piece body, such that the ledges 194 are integral to the main body portion 190. The upper carrier 146 and/or the lower carrier 148 may be composed of one or more plastics and/or metals.

FIG. 5 shows the flex bridge subassembly 110 in an assembled state poised for loading into the support bracket 108. The flex bridge subassembly 110 is assembled by coupling the flex circuit strips 112 to the upper and lower carriers 146, 148. The flex circuit strips 112 are coupled to the main body portions 180, 190 of the upper and lower carriers 146, 148, respectively. In the illustrated embodiment, two flex circuit strips 112 engage the front sides 174 of the main body portions 180, 190, and the other two flex circuit strips 112 engage the rear sides 176 of the main body portions 180, 190. The ears 182 of the upper carrier 146 and the ledges 194 of the lower carrier 148 extend laterally beyond the flex circuit strips 112 and are not covered by the flex circuit strips 112. Each flex circuit strip 112 has a mating end segment 184 that overlaps and couples to the upper carrier 146, a host end segment 186 that overlaps and couples to the lower carrier 148, and an intermediate segment 188 that extends from the mating end segment 184 to the host end segment 186. The intermediate segment 188 spans a gap defined between the upper carrier 146 and the lower carrier 148. Optionally, the mating ends 154 of the flex circuit strips 112 may generally align with the outer end 166 of the upper carrier 146, and the host ends 152 may generally align with the outer end 172 of the lower carrier 148.

The flex circuit strips 112 may be coupled to the upper and lower carriers 146, 148 via an adhesive, such as a tape, glue, epoxy, or the like, that bonds the respective carrier 146, 148 to the second side 158 (shown in FIG. 4) of each of the flex circuit strips 112. Alternatively, or in addition, the flex circuit strips 112 may be secured to the carriers 146, 148 via a fastener, such as a hook, a clamp, a snap, or the like. In an alternative embodiment, two flex circuit strips 112 are coupled directly to each other at the host ends 152 and at the mating ends 154, and the flex circuit strips 112 are coupled to the carriers 146, 148 via tension. In one example of the alternative embodiment, two coupled flex circuit strips 112 define a closed loop that receives both the upper and lower carriers 146, 148 within the loop.

In an embodiment, the flex bridge subassembly 110 is loaded into the corresponding frame 126 of the support bracket 108 through the top end 120. For example, the frame 126 includes a slot 196 at the top end 120 that receives the flex bridge subassembly 110 therethrough in a loading direction 197 that is parallel to the vertical axis 191. The slot 196 may be defined through a single cross member 130 or, alternatively, between two adjacent cross members 130. The flex bridge subassembly 110 is lowered through the slot 196 with the lower carrier 148 entering the frame 126 prior to the upper carrier 146. The ledges 194 of the lower carrier 148 are received in the channels 132 of the frame 126 and slide within the channels 132 towards the bottom end 122 as the flex bridge subassembly 110 is loaded. Engagement between the ledges 194 and the surfaces of the guide members 128 that define the channels 132 secures the lower carrier 148 in the track 124. For example, the frame 126 may be sized such that the lower carrier 148 is only able to exit the track 124 by sliding upward along the channels 132 through the slot 196 in a reverse loading direction.

Figure 6:
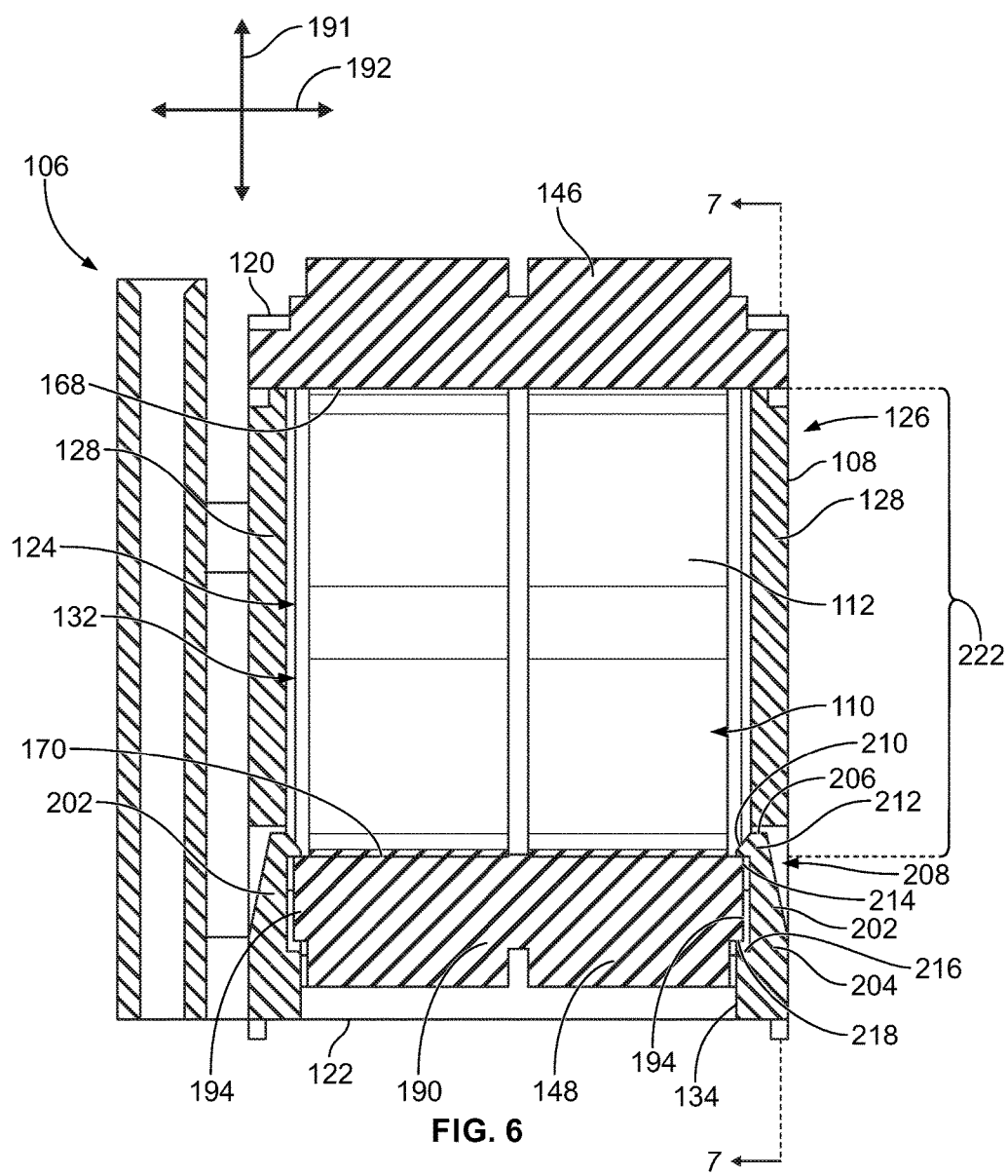
FIG. 6 is a front cross-sectional view of the electrical bridge device according to an embodiment.

FIG. 6 is a front cross-sectional view of the electrical bridge device 106 according to an embodiment. The cross-section extends through one of the frames 126 of the support bracket 108 and the upper and lower carriers 146, 148 of the flex bridge subassembly 110 held in the frame 126. The upper and lower carriers 146, 148 within the frame 126 are spaced apart from each other along the height of the support bracket 108 by a gap 222 along the vertical axis 191. The gap 222 has a distance extending between the inner end 168 of the upper carrier 146 and the inner end 170 of the lower carrier 148.

In an embodiment, the frame 126 includes deflectable retention latches 202 that extend from the guide members 128 into the channels 132 (for example, into the track 124). The deflectable retention latches 202 are cantilevered and extend from a fixed end 204 attached to the guide member 128 to a free end 206. The guide member 128 defines a pocket 208 that provides clearance to allow the retention latch 202 to deflect laterally outward. The retention latches 202 have respective hooks 212 at the free ends 206 that extend into the channels 132. The hooks 212 include ramp surfaces 210 and catch surfaces 214. As the flex bridge subassembly 110 is loaded into the frame 126 from the top end 120 towards the bottom end 122, each ledge 194 of the lower carrier 148 engages the ramp surface 210 of the hook 212, deflecting the retention latch 202 outward along the lateral axis 192 into the pocket 208 and allowing the lower carrier 148 to move beyond the hook 212. Once the inner end 170 of the lower carrier 148 passes beyond the catch surface 214 of the hook 212, the retention latch 202 resiles laterally inward. The catch surface 214 engages the inner end 170 of the lower carrier 148 at the ledges 194 to block upward vertical movement of the lower carrier 148 beyond the catch surface 214.

In an embodiment, each guide member 128 includes an upward-facing shoulder 216 that is configured to engage a complementary downward-facing shoulder 218 of the lower carrier 148 to block downward vertical movement of the lower carrier 148 beyond the shoulder 216. The shoulders 216 provide a hard stop that prevents the lower carrier 148 from falling out of the track 124 at the bottom end 122. The shoulders 218 of the lower carrier 148 may be defined by outer ends of the ledges 194 that extend from the main body portion 190 of the lower carrier 148.

In the illustrated embodiment, vertical movement of the lower carrier 148 relative to the frame 126 is contained between the hook 212 and the upward-facing shoulder 216, lateral movement of the lower carrier 148 is contained between the interior surfaces 134 of the guide members 128 (for example, the interior surfaces 134 along the retention latches 202). Although not shown in FIG. 6, longitudinal (or depth) movement of the lower carrier 148 is contained between opposing surfaces of each channel 132. The frame 126 may be constructed to provide clearance gaps that allow for limited movement of the lower carrier 148 relative to the frame 126 along at least one, if not all three, directional axes. The one or more clearance gaps allow the host ends 152 (shown in FIG. 5) of the flex circuit strips 112 to self-align with the first conductor 116 (shown in FIG. 8) during a mating operation. In general, the lower carrier 148 is held in place within the frame 126 and prevented from moving relative to the frame 126, beyond the movement permitted within the clearance gaps, once the retention latches 202 are secured to the lower carrier 148.

As shown in FIG. 6, when the flex bridge subassembly 110 is fully loaded in the frame 126, the lower carrier 148 is held proximate to the bottom end 122 and the upper carrier 146 is held at the top end 120. Optionally, the flex circuit strips 112 do not directly engage the support bracket 108, but rather are held in the support bracket 108 via the engagement between the upper and lower carriers 146, 148 and the support bracket 108.

Referring now back to the perspective view of the electrical bridge device 106 shown in FIG. 3, the upper carrier 146 and the flex circuit strips 112 may protrude beyond the top end 120 of the frame 126. Therefore, the mating ends 154 of the flex circuit strips 112 can be received within a receptacle of the corresponding second connector 118 (shown in FIG. 2) to electrically connect to the second connector 118 while the frame 126 avoids mechanically interfering with the mating operation.

In an embodiment, the intermediate segment 188 of each flex circuit strip 112 extending across the gap 222 (shown in FIG. 6) between the upper and lower carriers 146, 148 has a length that is greater than the gap distance. As a result, the intermediate segment 188 has a curved profile. For example, the flex circuit strips 112 may bow outward along the longitudinal axis 193. Optionally, curved portions of the flex circuit strips 112 may extend at least partially through the window 114 of the corresponding frame 126, which is defined as the space between the guide members 128 and the cross members 130. The curved flex circuit strips 112 provide slack to accommodate movement of the upper carrier 146 along the vertical axis 191. The curves in the flex circuit strips 112 may also provide a resilient force that forces the upper and lower carriers 146, 148 away from each other along the track 124. For example, the resilient force provided by the curved flex circuit strips 112 may oppose mating forces that force the upper carrier 146 downward towards the lower carrier 148.

In an embodiment, each frame 126 of the support bracket 108 includes two sockets 220 at the top end 120. The two sockets 220 are located on opposite sides of the slot 196 along the lateral axis 192. The sockets 220 define portions of the track 124. The two ears 182 of the upper carrier 146 are received in the sockets 220 when the flex bridge subassembly 110 is loaded into the frame 126. Each ear 182 is retained in one of corresponding sockets 220 to secure the upper carrier 146 to the frame 126.

Figure 7:
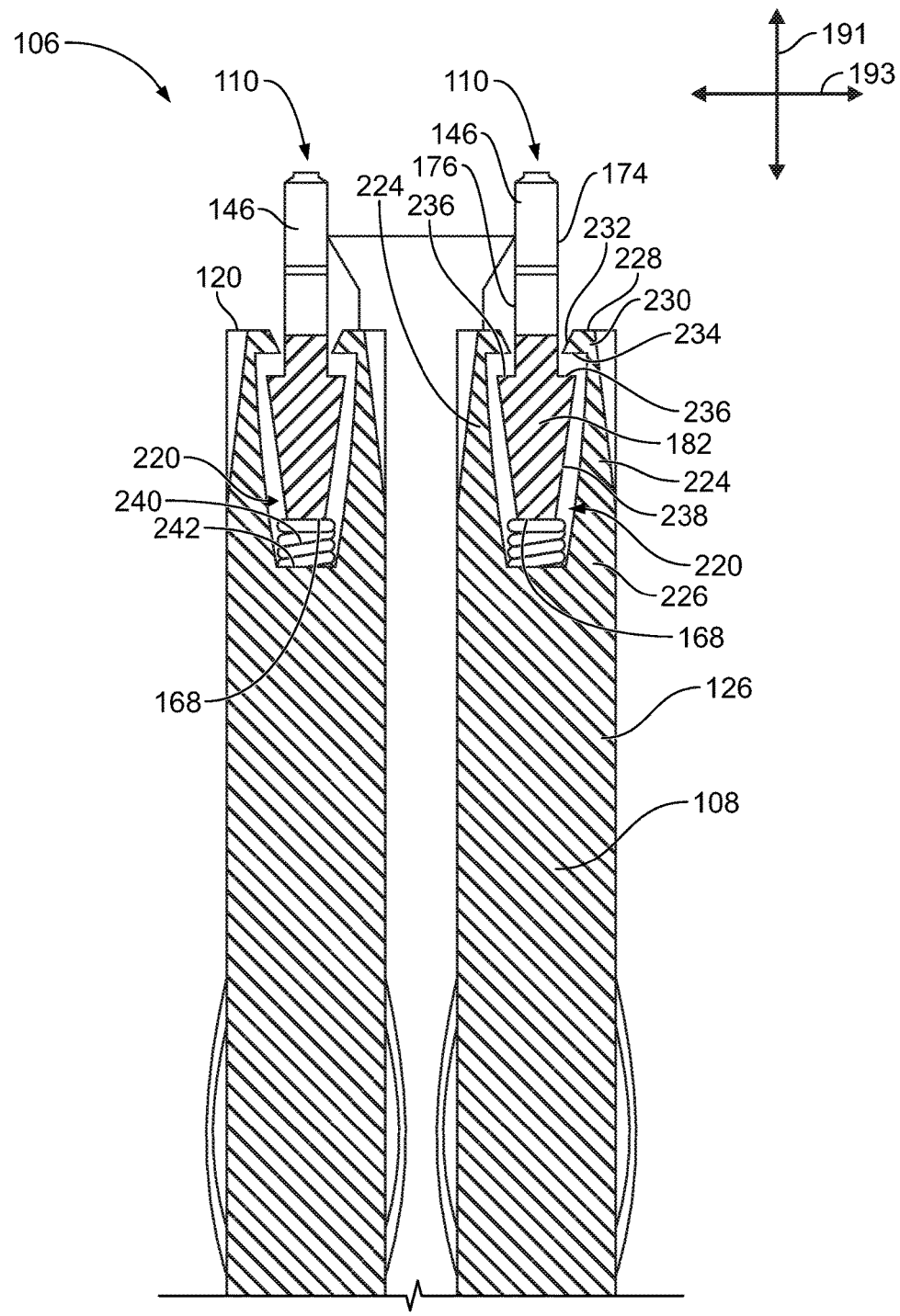
FIG. 7 is a side cross-sectional view of a portion of the electrical bridge device according to an embodiment.

FIG. 7 is a side cross-sectional view of a portion of the electrical bridge device 106 according to an embodiment. The cross-section is taken along line 7-7 shown in FIG. 6. The illustrated portion is an upper portion that includes the top end 120 of the support bracket 108 and the upper carriers 146 of the two flex bridge subassemblies 110 held by the support bracket 108. In an embodiment, each upper carrier 146 is retained in the corresponding socket 220 via at least one deflectable finger 224. The support bracket 108 in the illustrated embodiment includes two opposing deflectable fingers 224 associated with each socket 220. The deflectable fingers 224 may resemble the retention latches 202 (shown in FIG. 6) that engage the lower carrier 148 (FIG. 6). For example, each deflectable finger 224 may be cantilevered to extend from a fixed end 226 attached to the frame 126 to a free end 228. The deflectable fingers 224 also include respective hooks 230 that have ramp surfaces 232 and catch surfaces 234. The deflectable fingers 224 are shown in more detail in FIG. 10. In the illustrated embodiment, the ears 182 of each upper carrier 146 include shelves 236 that project outward along the longitudinal axis 193 from both the front side 174 and the rear side 176 of the upper carrier 146. The ears 182 are tapered from the shelves 236 to the inner end 168 of the upper carrier 146 such that a thickness of the ears 182 diminishes from the shelves 236 to the inner end 168 to define ramp surfaces 238.

As the flex bridge subassembly 110 is loaded into the frame 126, the ears 182 of the upper carrier 146 are lowered into the sockets 220. The ramp surfaces 238 of the ears 182 engage the ramp surfaces 232 of the deflectable fingers 224, thereby deflecting the fingers 224 outward in opposite directions along the longitudinal axis 193. Once the shelves 236 of the ears 182 move beyond the catch surfaces 234 of the deflectable fingers 224, the hooks 230 of the opposing fingers 224 resile towards one another. The catch surfaces 234 are configured to engage the shelves 236 to secure the upper carrier 146 within the frame 126 by blocking the ears 182 from moving vertically out of the sockets 220.

In an embodiment, the electrical bridge device 106 include at least one spring 240 that engages the inner end 168 of the upper carrier 146 and forces the upper carrier 146 upwards in the frame 126 towards the top end 120. In the illustrated embodiment, one spring 240 is disposed within each socket 220 and engages the ear 182 of the upper carrier 146 that is received within that socket 220. The spring 240 may be secured to (and carried by) the frame 126 or, alternatively, the upper carrier 146. For example, the spring 240 may be secured to a floor 242 of the socket 220 or to the inner end 168 of the upper carrier 146 along the ear 182. The spring 240 in the illustrated embodiment is a coil spring, but may be other types of springs (e.g., a leaf spring) or other resilient members in other embodiments.

Figure 8:
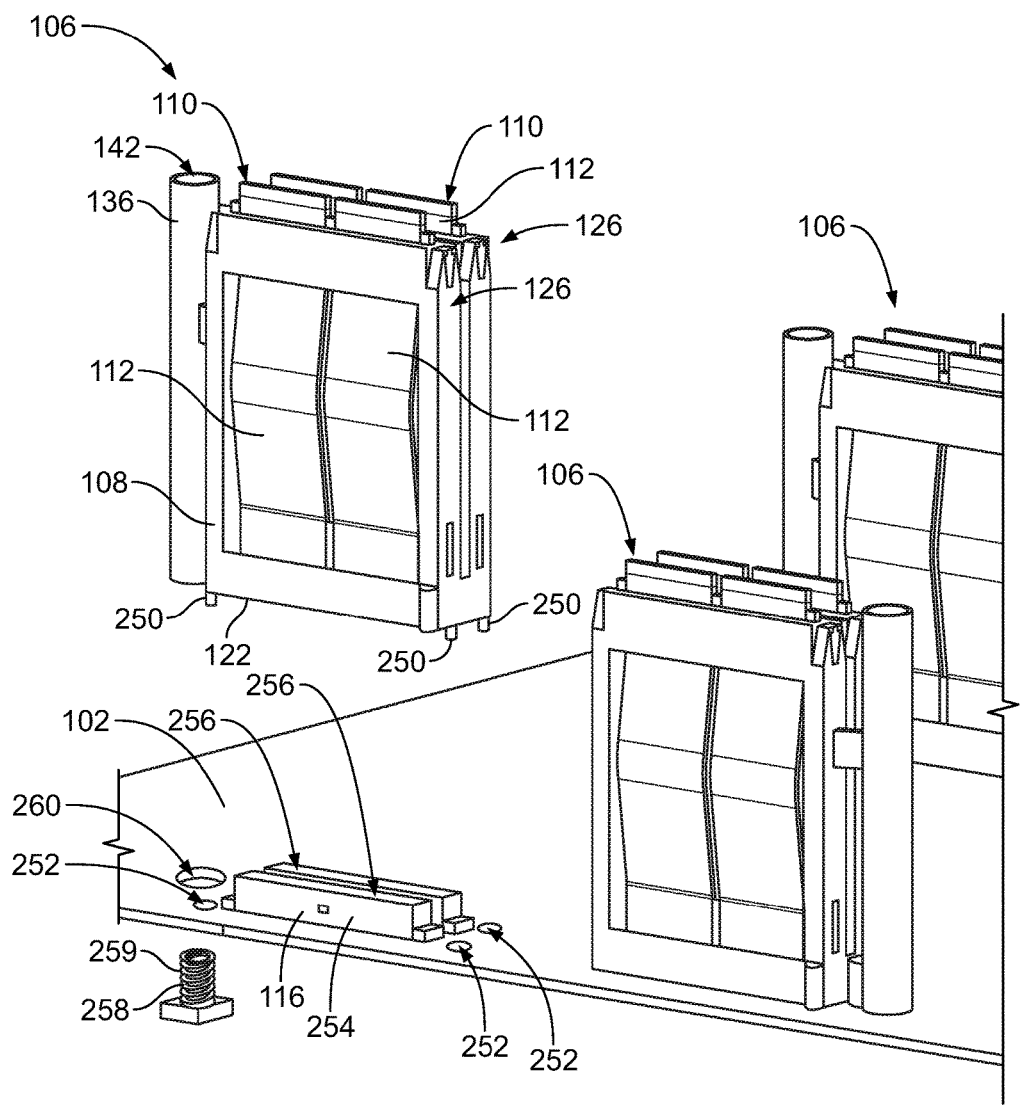
FIG. 8 is a perspective view of multiple electrical bridge devices mounted to a host circuit board and one electrical bridge device poised for mounting to the host circuit board according to an embodiment.

FIG. 8 is a perspective view of multiple electrical bridge devices 106 mounted to the host circuit board 102 and one electrical bridge device 106 poised for mounting to the host circuit board 102 according to an embodiment. The bottom end 122 of the support bracket 108 is configured to be mounted to the host circuit board 102. For example, the support bracket 108 includes at least one alignment post 250 protruding from the bottom end 122. The support bracket 108 includes multiple alignment posts 250 in the illustrated embodiment. Each alignment post 250 is received in a corresponding alignment hole 252 on the host circuit board 102. The alignment holes 252 are arranged and oriented relative to the first connector 116 mounted to the host circuit board 102.

In the illustrated embodiment, the first connector 116 is a card edge connector that includes a housing 254 that defines two receptacle slots 256. Each receptacle slot 256 is configured to receive the host ends 152 (shown in FIG. 5) of the flex circuit strips 112 of one of the flex bridge subassemblies 110. The bottom end 122 of the frames 126 of the support bracket 108 may be configured to shroud the first connector 116. The support bracket 108 may or may not engage the housing 254 of the first connector 116. In an embodiment, receipt of the alignment posts 250 into the alignment holes 252 may provide coarse alignment between the electrical bridge device 106 and the first connector 116. As described above with reference to FIG. 6, the one or more clearance gaps that allow the lower carrier 148 (shown in FIG. 6) limited movement relative to the support bracket 108 may provide fine alignment between the host ends 152 of the flex circuit strips 112 and the receptacle slots 256 of the connector 116. For example, as the electrical bridge device 106 is lowered onto the host circuit board 102 and the posts 250 are received in the alignment holes 252, any residual misalignment between the host ends 152 of the flex circuit strips 112 and the receptacle slots 256 may be corrected automatically (for example, self-corrected) as the connector housing 254 forces the lower carrier 148 to move within the clearance gaps relative to the support bracket 108.

Optionally, the electrical bridge device 106 may be fastened to the host circuit board 102 via a bolt or screw 258 that is inserted through a fastener opening 260 in the circuit board 102 and is received in the aperture 142 of the guide barrel 136 at the bottom end 122. For example, the guide barrel 136 may include helical threads (not shown) that engage complementary threads 259 of the bolt 258. Alternatively, a thread-forming screw could be used which threads directly into the guide barrel 136, which is unthreaded prior to the insertion of the screw.

Figure 9:
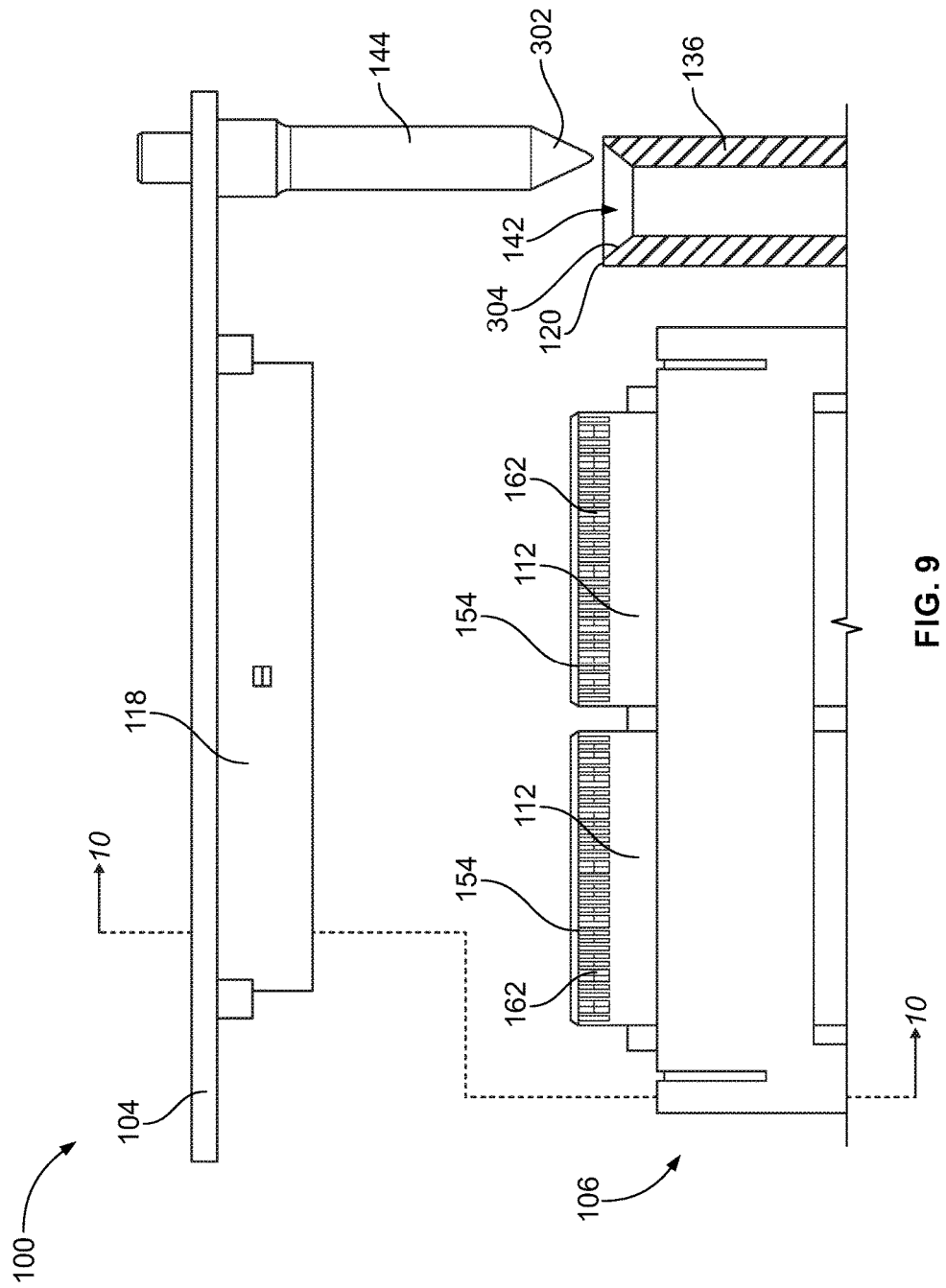
FIG. 9 illustrates a front view of a portion of the electrical system showing an electrical bridge device poised for electrically connecting to a connector mounted to a mating circuit board according to an embodiment.

FIG. 9 illustrates a front view of a portion of the electrical system 100 showing an electrical bridge device 106 poised for electrically connecting to the second connector 118 that is mounted to the mating circuit board 104 according to an embodiment. For example, after the electrical bridge device 106 is mounted and electrically connected to the host circuit board 102 as shown in FIG. 8, the electrical bridge device 106 is mated to the second connector 118 to electrically connect to the mating circuit board 104.

The mating circuit board 104 optionally includes an alignment pin 144 that is received in the aperture 142 of the guide barrel 136 as the electrical bridge device 106 is moved relative to the mating circuit board 104. For example, the relative movement may be accomplished by the electrical bridge device 106 (and attached host circuit board 102) moving towards the mating circuit board 104 and/or the mating circuit board 104 moving towards the electrical bridge device 106. The alignment pin 144 is received in the aperture 142 through the top end 120 of the guide barrel 136. The alignment pin 144 includes a tapered distal end segment 302. The guide barrel 136, shown in cross-section in FIG. 9, includes a tapered lead-in 304 at the top end 120 such that the diameter of the aperture 142 is greater at the lead-in 304 than along a section of the guide barrel 136 below the lead-in 304.

The tapered distal end segment 302 and tapered lead-in 304 provide coarse alignment between the mating circuit board 104 (and the second connector 118 thereon) and the electrical bridge device 106. For example, in the illustrated orientation, the alignment pin 144 is poised to engage a right portion of the tapered lead-in 304 of the guide barrel 136. The engagement between the tapered distal end segment 302 and the lead-in 304 guides the pin 144 to the left (and/or the guide barrel 136 to the right) in order for the alignment pin 144 to align with the aperture 142 and be fully received therein. As a result of the interaction between the alignment pin 144 and the guide barrel 136, the mating circuit board 104 moves to the left and/or the electrical bridge device 106 moves to the right to better align the mating ends 154 of the flex circuit strips 112 with the electrical connector 118.

Figure 10:
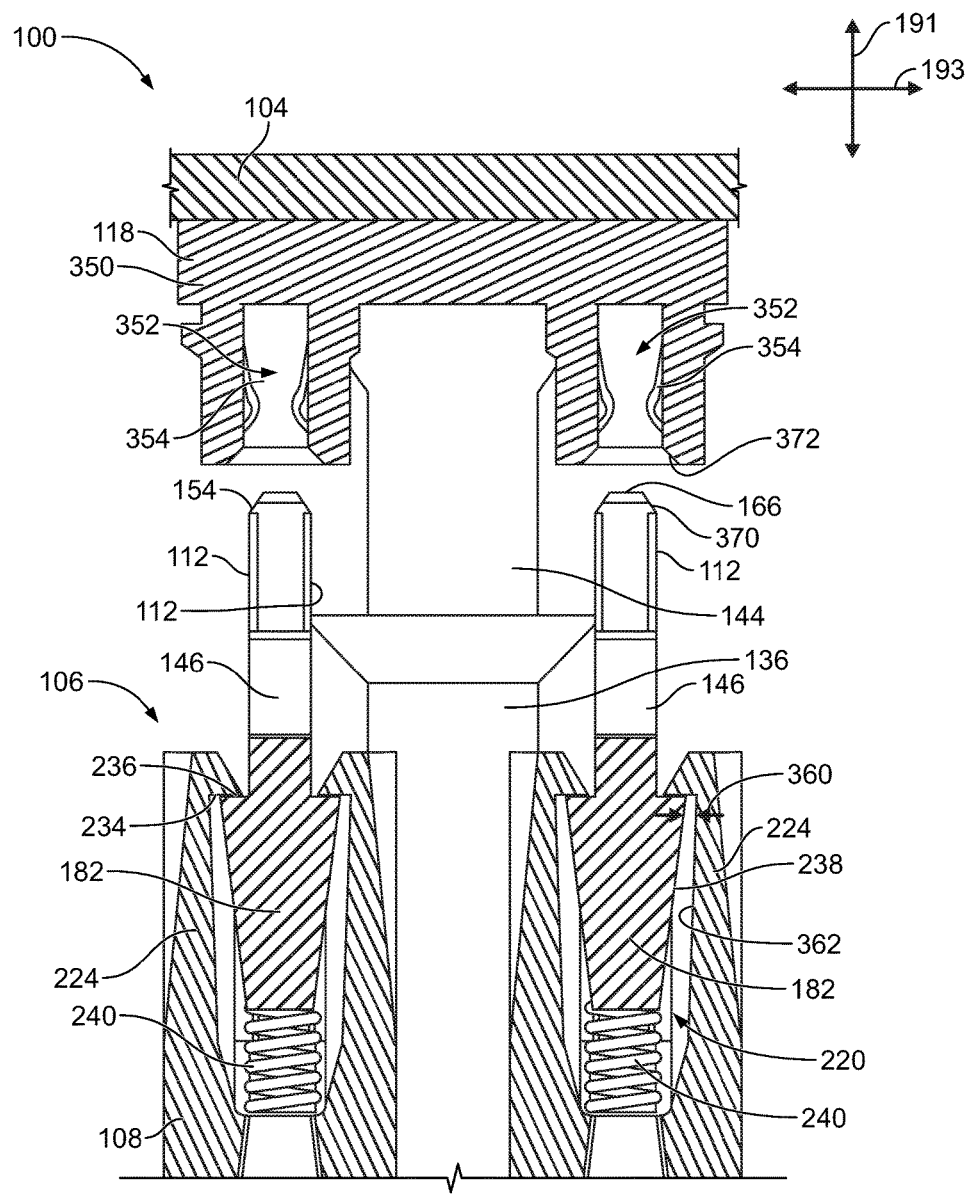
FIG. 10 is a side cross-sectional view of a portion of the electrical system according to an embodiment.

FIG. 10 is a side cross-sectional view of a portion of the electrical system 100 according to an embodiment. The cross-section is taken along the line 10-10 shown in FIG. 9. As shown in FIG. 10, the second connector 118 includes a housing 350 that defines two receptacle slots 352. The connector 118 includes deflectable contacts 354 within the receptacle slots 352 that are configured to engage and electrically connect to the contact pads 162 (shown in FIG. 9) at the mating ends 154 of the flex circuit strips 112.

In an embodiment, although the interaction between the alignment pin 144 and the guide barrel 136 provides coarse alignment, fine alignment between the mating ends 154 and the connector 118 is provided in part by the upper carriers 146 floating relative to the support bracket 108. For example, the sockets 220 are sized with dimensions greater than the corresponding dimensions of the ears 182 of the upper carriers 146 such that at least one clearance gap 360 is defined between the ears 182 and interior surfaces 362 that define the sockets 220. For example, in the illustrated embodiment, a clearance gap 360 is defined along the longitudinal axis 193 between the ramp surfaces 238 of the ear 182 and the inner surfaces 362 of the deflectable fingers 224. Therefore, if the upper carrier 146, which holds the mating ends 154 of the flex circuit strips 112 thereon, is not properly aligned relative to the corresponding receptacle slot 352 along the longitudinal axis 193, the upper carrier 146 is able to move longitudinally into the clearance gap 360 to better align with the receptacle slot 352.

In the illustrated embodiment, the outer end 166 of the upper carrier 146 has a tapered end segment 370 (similar to the alignment pin 144) and the receptacle slot 352 has a tapered lead-in 372 (similar to the guide barrel 136). The tapered end segment 370 of the upper carrier 146 is configured to engage the tapered lead-in 372 of the receptacle slot 352 during mating, which forces the upper carrier 146 to move within the longitudinal clearance gap 360 to automatically align the flex circuit strips 112 with the receptacle slot 352. Although linear, axial movement of the upper carrier 146 is described, the upper carrier 146 may also pivot relative to the support bracket 108 if necessary.

In the illustrated embodiment, the springs 240 force the upper carriers 146 vertically upward such that the shelves 236 of the ears 182 are held in contact with the catch surfaces 234 of the deflectable fingers 224. During the mating operation, frictional forces applied on the upper carriers 146 by the housing 350 and/or the contacts 354 of the connector 118 may cause the springs 240 to compress, at least temporarily, resulting in a gap between the shelves 236 and the catch surfaces 234 of the deflectable fingers 224. The compression of the springs 240 provides a mating tolerance along the vertical axis 191. In an alternative embodiment in which the electrical bridge device 106 lacks springs, the sockets 220 may be sized taller than the ears 182 such that a vertical clearance gap, similar to the longitudinal clearance gap 360, is defined above and/or below the ears 182.

Although the side view of FIG. 10 does not show the electrical bridge device 106 along the lateral axis 192 (shown in FIG. 3), the support bracket 108 may be configured to provide a clearance gap along the lateral axis to allow lateral movement of the upper carrier 146 relative to the support bracket 108. In an embodiment, the upper carrier 146 is floatable relative to the support bracket 108 along all three of the vertical axis 191, the lateral axis 192, and the longitudinal axis 193.

When the flex circuit strips 112 are received in the receptacle slots 352 and mated to the connector 118, the flex circuit strips 112 define electrically conductive paths between the host circuit board 102 (shown in FIG. 8) and the mating circuit board 104. The flex circuit strips 112 are configured to carry electrical signals between the host and mating circuit boards 102, 104. The electrical signals may be data signals, control signals, or the like. The flex circuit strips 112 may also be configured to carry power between the boards 102, 104 by combining multiple conductor traces into a single wide trace optimized for higher current carrying capacity. The floatability of the upper carrier 146 allows the electrical bridge device 106 to accommodate variations attributable to tolerance stack-up without decreased signal performance or damage to the electrical components.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical bridge device comprising:
   a support bracket extending a height between a top end and an opposite bottom end, the bottom end configured to be mounted to a host circuit board, the support bracket including a frame that extends axially between the top and bottom ends; and
   a flex bridge subassembly including an upper carrier held in the frame at least proximate to the top end and a lower carrier held in the frame at least proximate to the bottom end and spaced apart from the upper carrier along the height of the support bracket, the flex bridge subassembly further including an electrically conductive flex circuit strip coupled to the upper carrier and the lower carrier and extending therebetween, the flex circuit strip extending between a host end and a mating end, the host end configured to electrically connect to a first connector on the host circuit board and the mating end configured to electrically connect to a second connector on a mating circuit board to provide an electrical circuit path between the host circuit board and the mating circuit board, wherein the upper carrier within the frame is floatable relative to the support bracket along a vertical axis parallel to the height of the support bracket to allow the mating end of the flex circuit strip to align with the second connector.

2. The electrical bridge device of claim 1, wherein the upper carrier within the frame is floatable along a lateral axis and a longitudinal axis that are perpendicular to the vertical axis.

3. The electrical bridge device of claim 1, wherein the flex circuit strip has a first side and an opposite second side, the flex circuit strip including a first set of contact pads disposed on the first side at the host end and a second set of contact pads disposed on the first side at the mating end.

4. The electrical bridge device of claim 3, wherein the second side of the flex circuit strip engages the upper carrier and the lower carrier.

5. The electrical bridge device of claim 1, wherein the support bracket further includes a guide barrel coupled to the frame, the guide barrel defining an aperture that is open along the top end of the support bracket and receives an alignment pin mounted to the mating circuit board to provide coarse alignment between the mating end of the flex circuit strip and the second connector.

6. The electrical bridge device of claim 1, wherein the mating end of the flex circuit strip protrudes beyond the top end of the support bracket.

7. The electrical bridge device of claim 1, wherein the upper carrier and the lower carrier are spaced apart from each other in the frame by a gap having a first distance, an intermediate segment of the flex circuit strip extending across the gap having a length greater than the first distance such that the intermediate segment of the flex circuit strip is curved.

8. The electrical bridge device of claim 1, wherein the upper carrier extends between an inner end and an opposite outer end, the inner end facing the lower carrier, the support bracket further including a spring engaging the inner end of the upper carrier and forcing the upper carrier within the frame upwards toward the top end of the support bracket.

9. The electrical bridge device of claim 1, wherein the support bracket includes a slot at the top end of the support bracket to receive the lower carrier and the upper carrier into the frame, the support bracket further including two sockets at the top end on opposite sides of the slot, the upper carrier including a main body portion that engages the flex circuit strip and two ears extending laterally from the main body portion in opposite directions, each of the ears received in a corresponding one of the sockets and being retained in the corresponding socket via at least one deflectable finger.

10. The electrical bridge device of claim 9, wherein the sockets are sized greater than the ears of the upper carrier such that at least one clearance gap is defined between each of the ears and interior surfaces of the support bracket that define the corresponding sockets, the upper carrier movable into the at least one clearance gap to float relative to the support bracket.

11. The electrical bridge device of claim 1, wherein the lower carrier extends between an inner end and an opposite outer end, the inner end facing the upper carrier, the frame defining a track that receives the lower carrier therein, the frame including a deflectable retention latch with a hook that extends into the track and engages the inner end of the lower carrier to block vertical movement of the lower carrier within the track towards the top end of the support bracket.

12. The electrical bridge device of claim 1, wherein the support bracket includes an alignment post protruding from the bottom end thereof, the alignment post received in an alignment hole of the host circuit board to align the support bracket thereto.

13. An electrical bridge device comprising:
a support bracket extending a height between a top end and an opposite bottom end, the bottom end configured to be mounted to a host circuit board, the support bracket including a frame that extends axially between the top and bottom ends, wherein the frame has two parallel guide members and cross members extending between and connecting the two guide members, the guide members including channels; and
a flex bridge subassembly including an upper carrier held in the frame at least proximate to the top end and a lower carrier held in the frame at least proximate to the bottom end and spaced apart from the upper carrier along the height of the support bracket, the lower carrier including ledges received in the channels of the guide members, the flex bridge subassembly further including an electrically conductive flex circuit strip coupled to the upper carrier and the lower carrier and extending therebetween, the flex circuit strip extending between a host end and a mating end, the host end configured to electrically connect to a first connector on the host circuit board and the mating end configured to electrically connect to a second connector on a mating circuit board to provide an electrical circuit path between the host circuit board and the mating circuit board, wherein the upper carrier within the frame is floatable relative to the support bracket to allow the mating end of the flex circuit strip to align with the second connector.

14. An electrical bridge device comprising:
a support bracket extending a height between a top end and an opposite bottom end, the bottom end configured to be mounted to a host circuit board, the support bracket including a guide barrel and a frame coupled to the guide barrel, the frame extending axially between the top and bottom ends, the guide barrel defining an aperture that is open along the top end for receiving an alignment pin that is mounted to a mating circuit board; and
a flex bridge subassembly including an upper carrier held in the frame at least proximate to the top end and a lower carrier held in the frame at least proximate to the bottom end and spaced apart from the upper carrier along the height of the support bracket, the flex bridge subassembly further including an electrically conductive flex circuit strip coupled to the upper carrier and the lower carrier and extending therebetween, the flex circuit strip extending between a host end and a mating end, the host end configured to electrically connect to a first connector on the host circuit board and the mating end configured to electrically connect to a second connector on the mating circuit board to provide an electrical circuit path between the host circuit board and the mating circuit board, the upper carrier within the frame being floatable relative to the support bracket, wherein the guide barrel receiving the alignment pin provides coarse alignment between the mating end of the flex circuit strip and the second connector, and the floatability of the upper carrier within the frame allows for fine alignment between the mating end of the flex circuit strip and the second connector.

15. The electrical bridge device of claim 14, wherein the upper carrier within the frame is floatable along a vertical axis parallel to the height of the support bracket, along a lateral axis, and along a longitudinal axis.

16. The electrical bridge device of claim 14, wherein the mating end of the flex circuit strip protrudes beyond the top end of the support bracket, the flex circuit strip including contact pads at the mating end.

17. The electrical bridge device of claim 14, wherein the upper carrier and the lower carrier have a front side and an opposite rear side, the flex circuit strip defining a first flex circuit strip that is coupled to the respective front sides of the upper carrier and the lower carrier, the flex bridge subassembly further including a second flex circuit strip that is coupled to the respective rear sides of the upper carrier and the lower carrier.

18. The electrical bridge device of claim 14, wherein the upper carrier and the lower carrier are spaced apart from each other in the frame by a gap having a first distance, an intermediate segment of the flex circuit strip extending across the gap having a length greater than the first distance such that the intermediate segment of the flex circuit strip is curved.

19. The electrical bridge device of claim 14, wherein the upper carrier extends between an inner end and an opposite outer end, the inner end facing the lower carrier, the support bracket further including a spring engaging the inner end of the upper carrier and forcing the upper carrier upwards along the frame toward the top end of the support bracket.

20. The electrical bridge device of claim 14, wherein the support bracket includes a slot at the top end of the support bracket to receive the lower carrier and the upper carrier into the frame, the support bracket further including two sockets at the top end on opposite sides of the slot, the upper carrier including a main body portion that engages the flex circuit strip and two ears extending laterally from the main body portion in opposite directions, each of the ears received in a corresponding one of the sockets and being retained in the corresponding socket via at least one deflectable finger.

* * * * *